United States Patent
Kim

(10) Patent No.: US 8,269,534 B2
(45) Date of Patent: Sep. 18, 2012

(54) DELAY LOCKED LOOP CIRCUIT AND SEMICONDUCTOR DEVICE HAVING THE DELAY LOCKED LOOP CIRCUIT

(75) Inventor: Jun Bae Kim, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 88 days.

(21) Appl. No.: 12/879,930

(22) Filed: Sep. 10, 2010

(65) Prior Publication Data

US 2011/0109357 A1 May 12, 2011

(30) Foreign Application Priority Data

Nov. 9, 2009 (KR) .................. 10-2009-0107354

(51) Int. Cl.
*H03L 7/06* (2006.01)

(52) U.S. Cl. .................. 327/158; 327/153; 327/155

(58) Field of Classification Search .................. 327/153, 327/155, 158
See application file for complete search history.

(56) References Cited

U.S. PATENT DOCUMENTS

2004/0051569 A1 * 3/2004 Jeon ............................. 327/153
2007/0152680 A1 7/2007 Fujisawa et al.
2007/0200604 A1 8/2007 Yun et al.
2008/0001642 A1 1/2008 Yun et al.

FOREIGN PATENT DOCUMENTS

| JP | 2007-121114 | 5/2007 |
| JP | 2007-228589 | 9/2007 |
| KR | 102007008478 A | 8/2007 |
| KR | 102008000302 A | 1/2008 |

* cited by examiner

*Primary Examiner* — John Poos
(74) *Attorney, Agent, or Firm* — Muir Patent Consulting, PLLC

(57) ABSTRACT

A delay locked loop (DLL) circuit is disclosed. The DLL circuit includes a delay circuit and a phase adjusting circuit. The phase adjusting circuit is configured to receive a clock signal output from the delay circuit, pass the clock signal through a N-divider and a replica path to create a N-divided delay signal, and detect phase information about an external clock signal in response to a rising edge and a falling edge of the N-divided delay signal, wherein N denotes a natural number. The delay circuit is configured to output the clock signal by adjusting a phase of the external clock signal in response to a result of the detection. A semiconductor device, semiconductor system, and method are also disclosed.

13 Claims, 11 Drawing Sheets

DELAY LOCKED LOOP CIRCUIT AND SEMICONDUCTOR DEVICE HAVING THE DELAY LOCKED LOOP CIRCUIT

CROSS-REFERENCE TO RELATED APPLICATIONS

This application claims priority under 35 U.S.C. §119 to Korean Patent Application No. 10-2009-0107354, filed on Nov. 9, 2009, in the Korean Intellectual Property Office, the disclosure of which is incorporated herein in its entirety by reference.

BACKGROUND

One or more embodiments disclosed herein relate to semiconductor devices, and more particularly, to a delay locked loop (DLL) circuit capable of reducing jitter, and a semiconductor device including the DLL circuit.

Synchronous semiconductor devices, such as synchronous DRAMs (SDRAMs), operate in synchronization with a reference clock provided from an external source or operate an internal circuit at timing having a predetermined phase relation with the phase of the reference clock. Accordingly, a timing clock generation circuit is installed in the synchronous semiconductor device.

In a synchronous semiconductor device, a DLL circuit is used as the timing clock generation circuit to remove an influence of a propagation delay of a reference clock. In other words, the DLL circuit includes a variable delay circuit that delays the reference clock to output a control clock having a predetermined timing, a phase comparison circuit that compares the phases of the reference clock and the control clock with each other and adjusts the amount of delay performed in the variable delay circuit so that the phases are matched with each other, and a delay control circuit.

SUMMARY

The disclosed embodiments provide a delay locked loop (DLL) circuit that can detect the phase of an external clock signal by using a rising edge and a falling edge of a N-divided signal obtained from a clock signal and adjust the phase of the external clock signal according to a result of the detection so as to output the clock signal, and a semiconductor device including the DLL circuit. The disclosed embodiments also provide a method of operating the DLL circuit.

According to one embodiment, a delay locked loop (DLL) circuit is disclosed. The DLL circuit includes a delay circuit and a phase adjusting circuit. The phase adjusting circuit is configured to receive a clock signal output from the delay circuit, pass the clock signal through a N-divider and a replica path to create a N-divided delay signal, and detect phase information about an external clock signal in response to a rising edge and a falling edge of the N-divided delay signal, wherein N denotes a natural number. The delay circuit is configured to output the clock signal by adjusting a phase of the external clock signal in response to a result of the detection.

In another embodiment, a semiconductor device is disclosed. The semiconductor device comprises an output circuit configured to output data in response to a DLL clock signal, and a DLL circuit configured to generate the DLL clock signal. In one embodiment, the DLL circuit comprises a delay circuit, a phase adjusting circuit, and a clock tree. The phase adjusting circuit is configured to receive a clock signal output from the delay circuit, pass the clock signal through a N-divider and a replica path to create a N-divided delay signal, and detect phase information about an external clock signal in response to a rising edge and a falling edge of the N-divided delay signal, wherein N denotes a natural number. The clock tree is configured to generate the DLL clock signal in response to the clock signal. The delay circuit is configured to output the clock signal by adjusting a phase of the external clock signal in response to a result of the detection.

In a further embodiment, a semiconductor system is disclosed. The semiconductor system includes a semiconductor device and a processor for controlling an operation of the semiconductor device. In one embodiment, the semiconductor device comprises an output circuit for outputting data in response to a DLL clock signal, and a DLL circuit for generating the DLL clock signal. The DLL circuit comprises a phase adjusting circuit for receiving a clock signal output from a delay circuit, dividing the clock signal by N and passing the clock signal through a replica path to create a N-divided delay signal, and detecting phase information about an external clock signal in response to a rising edge and a falling edge of the N-divided delay signal, wherein N denotes a natural number; a delay circuit for outputting the clock signal by adjusting a phase of the external clock signal in response to a result of the detection; and a clock tree for generating the DLL clock signal in response to the clock signal.

In another embodiment, a method is disclosed. The method includes receiving, by a DLL circuit, an external clock signal. The method further includes creating a clock signal based on the external signal, wherein the clock signal has an adjusted phase in relation to the external clock signal. The method additionally includes creating a N-divided delay signal based on the clock signal, wherein N denotes a natural number. The method also includes detecting phase information about the external clock signal in response to a rising edge and a falling edge of the N-divided delay signal, and adjusting the phase of the external clock signal in response to a result of the detection.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
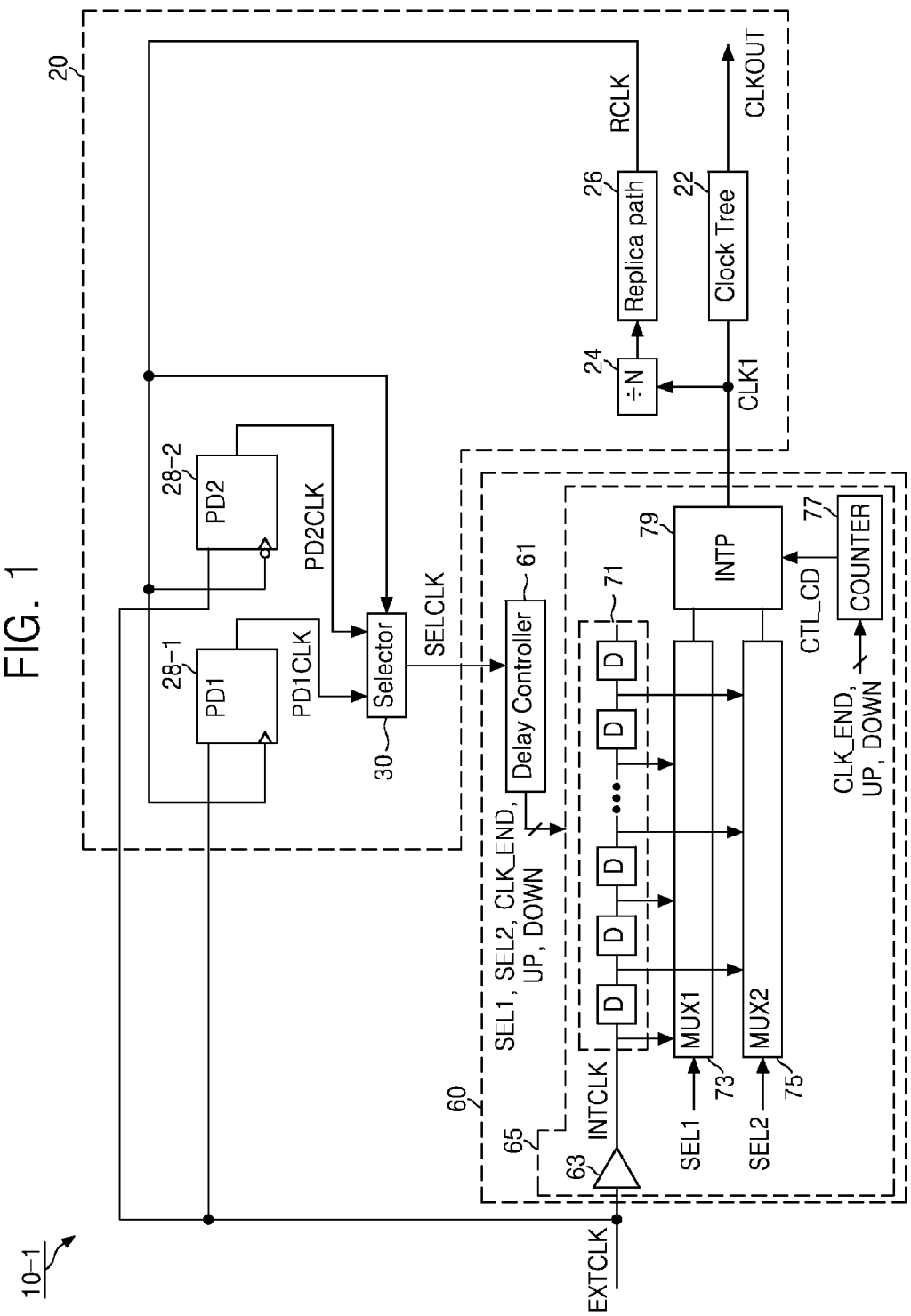
FIG. 1 is a block diagram of a delay locked loop (DLL) circuit according to one exemplary embodiment.

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two steps or figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

FIG. 1 is an exemplary block diagram of a delay locked loop (DLL) circuit 10-1 according to one embodiment. Referring to FIG. 1, the DLL circuit 10-1 includes a phase adjusting circuit 20 and a delay circuit 60.

The DLL circuit 10-1 may adjust the phase of an internal clock signal INTCLK so as to control the phase of an external clock signal EXTCLK to be consistent with that of a DLL clock signal CLKOUT (i.e., an internal clock used in an internal circuit, such as an input/output circuit) of the DLL circuit 10-1. In one embodiment, the phase adjusting circuit 20 may detect phase information (or edge information) of the external clock signal EXTCLK by using a rising edge and a falling edge of a signal obtained by dividing a frequency of a clock signal CLK1 output from the delay circuit 60 by N (where N is a natural number) (hereinafter, referred to as a N-divided signal), thereby generating a detection signal SELCLK. For example, the phase information may indicate the location of a rising or falling edge of the EXTCLK signal, and/or may indicate whether the phase of EXTCLK is ahead of or behind a desired CLKOUT phase (e.g., whether the edges of EXTCLK are in phase with the edges of CLKOUT).

The detection signal SELCLK may be input into the delay circuit 60, and as a result, the delay circuit 60 may adjust the phase of the internal clock signal INTCLK in response to the detection signal SELCLK, and may output a phase-adjusted internal clock signal as the clock signal CLK1.

In one embodiment, the phase adjusting circuit 20 may include a clock tree 22, a divider 24, a replica path 26, a first phase detector 28-1, a second phase detector 28-2, and a selector 30. The clock tree 22 is a circuit capable of controlling skew between clock signals and outputs the DLL clock signal CLKOUT corresponding to the clock signal CLK1. The DLL clock signal CLKOUT may be a signal obtained by delaying the clock signal CLK1. The divider 24 may divide the frequency of the clock signal CLK1 by N to output the N-divided signal, in order to reduce power which is to be consumed in the DLL circuit 10-1.

The replica path 26 may include a replica circuit and may delay an output signal of the divider 24 for a period of time equal to a delay time used in the clock tree 22. Although replica path 26 is shown as receiving the N-divided signal, replica path 26 may alternatively receive the clock signal CLK1 and output a delayed signal to N-divider 24. In either case, the clock signal CLK1 is passed through a N-divider and a replica path and a N-divided delay signal is output as RCLK.

The first and second phase detectors 28-1 and 28-2 may be used to determine whether the signal RCLK is in phase with the external clock signal EXTCLK. For example, in one embodiment, the first phase detector 28-1 may detect phase information PD1CLK of the external clock signal EXTCLK in response to a rising edge of an N-divided delay signal RCLK output by the replica path 26, and the second phase detector 28-2 may detect phase information PD2CLK of the external clock signal EXTCLK in response to a falling edge of the N-divided delay signal RCLK output by the replica path 26. Each of the first phase detector 28-1 and the second phase detector 28-2 may be implemented by a D-flip-flop.

Figure 2:
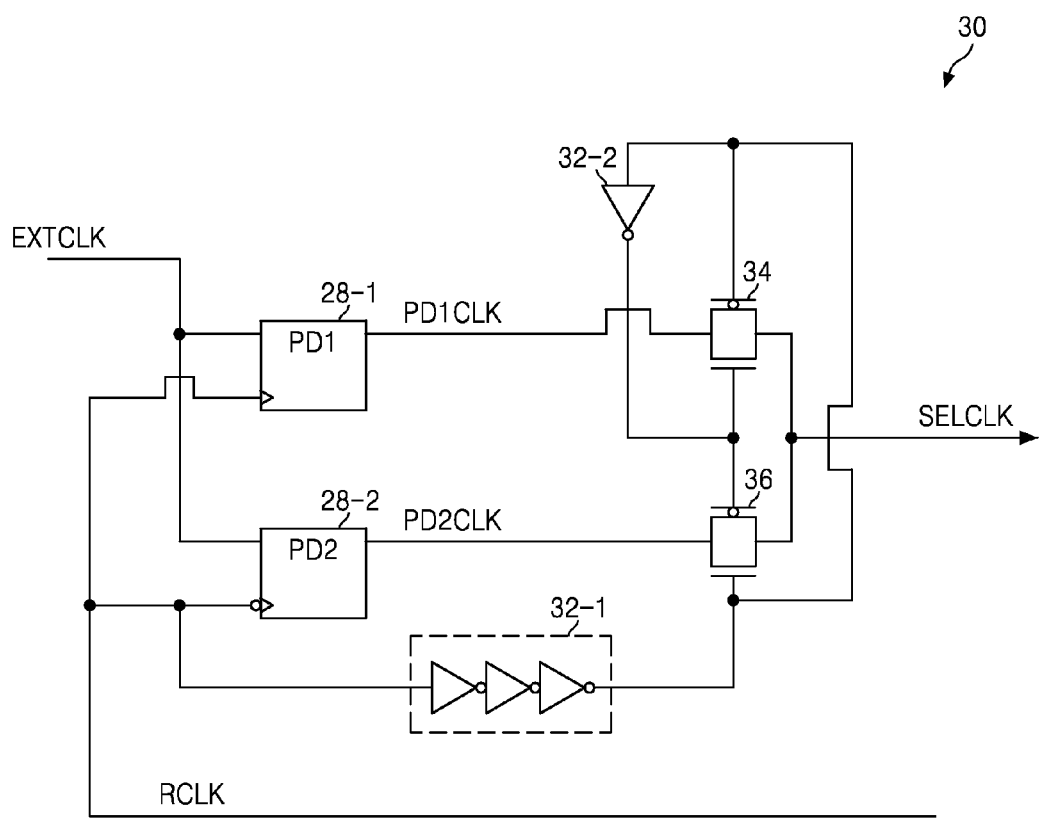
FIG. 2 is an exemplary circuit diagram of a selector of the DLL circuit illustrated in FIG. 1.

FIG. 2 is an exemplary circuit diagram of the selector 30 illustrated in FIG. 1. For convenience of explanation, FIG. 2 illustrates the selector 30 together with the first phase detector 28-1 and the second phase detector 28-2. The selector 30 may include a gating signal generator, a first transmission circuit 34, and a second transmission circuit 36.

The gating signal generator includes an inverter chain 32-1 and an inverter 32-2 and controls an operation of the first transmission circuit 34 and an operation of the second transmission circuit 36. The inverter chain 32-1, having a plurality of inverters serially connected to each other, buffers (for example, inverts) the N-divided delay signal RCLK output by the replica path 26 to output a control signal for controlling the operations of the first transmission circuit 34 and the second transmission circuit 36. According to different embodiments, the number of inverters included in the inverter chain 32-1 may be an odd number or an even number.

The inverter 32-2 inverts the control signal output by the inverter chain 32-1 so as to output an output signal for controlling the operations of the first transmission circuit 34 and the second transmission circuit 36. Thus, the first transmission circuit 34 and the second transmission circuit 36 control transmission operation in response to an output signal of the inverter chain 32-1, namely, the control signal output by the inverter chain 32-1, and an output signal of the inverter 32-2, namely, the control signal output by the inverter 32-2, respectively.

In one embodiment, the first transmission circuit 34 receives and outputs the phase information PD1CLK of the external clock signal EXTCLK output by the first phase detector 28-1 so as to serve as the detection signal SELCLK, in response to a rising edge and a logical high signal of the N-divided delay signal RCLK output by the replica path 26. The second transmission circuit 36 receives and outputs the phase information PD2CLK of the external clock signal EXTCLK output by the second phase detector 28-2 so as to serve as the detection signal SELCLK, in response to a falling edge and a logical low signal of the N-divided delay signal RCLK output by the replica path 26. For example, the phase information may include an indication of the logical level of EXTCLK that corresponds to a rising or falling edge of RCLK. Each of the first transmission circuit 34 and the second transmission circuit 36 may be implemented by a transmission gate.

Accordingly, the selector 30 may output an output signal PD1CLK of the first phase detector 28-1, namely, the phase information PD1CLK output by the first phase detector 28-1, or an output signal PD2CLK of the second phase detector 28-2, namely, the phase information PD2CLK output by the second phase detector 28-2, to serve as the detection signal SELCLK, in response to a rising edge and logical high signal or a falling edge and logical low signal of the N-divided delay signal RCLK output by the replica path 26. The delay circuit 60 may then adjust the phase of the internal clock signal INTCLK in response to the detection signal SELCLK so as to output the phase-adjusted internal clock signal as the clock signal CLK1.

The delay circuit 60 may include a delay controller 61 and a delay core 65. The delay controller 61 may output a plurality of control signals, namely, a first selection signal SEL1, a second selection signal SEL2, a coarse locking termination signal CLK_END, an up-signal UP, and a down-signal DOWN, for controlling the phase of the internal clock signal INTCLK, in response to the detection signal SELCLK. The delay core 65 may include a buffer 63, a plurality of delay cells 71, a first multiplexer 73, a second multiplexer 75, a counter 77, and a phase interpolator 79. Other circuitry may be used as well, without straying from the scope of the embodiments disclosed herein.

The buffer 63 buffers the external clock signal EXTCLK to output a buffered internal clock signal INTCLK. The delay cells 71 individually delay the internal clock signal INTCLK to output respective delay signals. The first multiplexer 73 outputs one of input signals input to odd-numbered delay cells from among the plurality of delay cells 71, in response to the first selection signal SEL1 from among the plurality of control signals. The second multiplexer 75 outputs one of input signals input to even-numbered delay cells from among the plurality of delay cells 71, in response to the second selection signal SEL2 from among the plurality of control signals.

When each of the first multiplexer 73 and the second multiplexer 75 selectively outputs a signal of a corresponding delay cell, the delay controller 61 outputs the coarse locking termination signal CLK_END, the up-signal UP, and the down-signal DOWN from among the plurality of control signals to the counter 77.

When the phase of the external clock signal EXTCLK leads the phase of the N-divided delay signal RCLK output by the replica path 26, the delay controller 61 outputs the up-signal UP. When the phase of the external clock signal EXTCLK lags behind the phase of the N-divided delay signal RCLK output by the replica path 26, the delay controller 61 outputs the down-signal DOWN. The counter 77 outputs a control code CTL_CD in response to at least one selected from the group consisting of the coarse locking termination signal CLK_END, the up-signal UP, and the down-signal DOWN. The phase interpolator 79 interpolates the phase of the signal output by the first multiplexer 73 and the phase of the signal output by the second multiplexer 75 so as to output the clock signal CLK1 as a result of the interpolation, in response to the control code CTL_CD (thereby performing fine locking).

Figure 3:
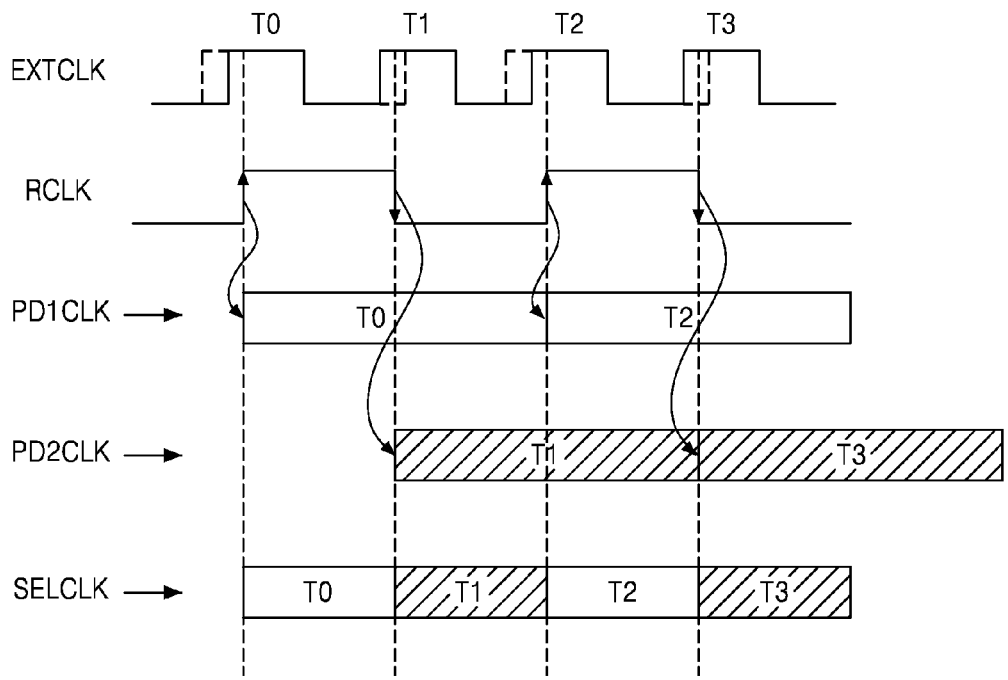
FIG. 3 is an exemplary timing diagram for explaining an operation of the DLL circuit of FIG. 1 when the divider illustrated in FIG. 1 is implemented by a divide-by-2 divider.

FIG. 3 is an exemplary timing diagram for explaining an operation of the DLL circuit 10-1 when the divider 24 is implemented by a divide-by-2 divider. An operation of the phase adjusting circuit 20 when the divider 24 is implemented by a divide-by-2 divider will now be described with reference to FIGS. 1 through 3.

Due to jitter, the phase information of the external clock signal EXTCLK may vary. A dotted portion of FIG. 3 indicates a case where the phase information (e.g., the rising edges) of the external clock signal EXTCLK varies due to jitter. For example, the solid line indicates the desired external clock signal, and the dashed line indicates the external clock signal that includes jitter.

The divider 24 divides the clock signal CLK1 by 2 to output a 2-divided signal. The 2-divided signal may be output as the replica clock signal RCLK by the replica path 26. The first phase detector 28-1 detects the phase information PD1CLK about a first portion T0 and a third portion T2 of the external clock signal EXTLCK, in response to a rising edge of the replica clock signal RCLK. The second phase detector 28-2 detects the phase information PD2CLK about a second portion T1 and a fourth portion T3 of the external clock signal EXTLCK, in response to a falling edge of the replica clock signal RCLK.

In one embodiment, RCLK is input to selector 30, as shown for example in FIG. 2, such that when the replica clock signal RCLK has a first level, for example, a high level, the first transmission circuit 34 of the selector 30 outputs the output signal PD1CLK of the first phase detector 28-1 to serve as the detection signal SELCLK. When the replica clock signal RCLK has a second level, for example, a low level, the second transmission circuit 36 of the selector 30 outputs the output signal PD2CLK of the second phase detector 28-2 to serve as the detection signal SELCLK. Accordingly, the detection signal SELCLK may include information about the external clock signal EXTCLK, for example, at all edges (i.e., rising and falling) of RCLK.

As described above, the DLL circuit 10-1 according to one embodiment may detect the edge information or phase information of the external clock signal EXTCLK at not only a rising edge of the replica clock signal RCLK but also a falling edge thereof. Thus, the DLL circuit 10-1 may track all of the rising edges of the external clock signal EXTCLK.

In one embodiment, delay controller 61 is configured such that when the detection signal SELCLK having a predetermined level (e.g., logical high or logical low) is detected M consecutive times (where M is a natural number, for example, 4) or more, the delay controller 61 selects among the control signals SEL1, SEL2, CLK_END, UP, and DOWN, in response to the detection signal SELCLK for controlling the phase of the internal clock signal INTCLK; but until SELCLK is detected as having the same level at least M consecutive times, the delay controller 61 does not change the previously selected control signals.

Figure 4:
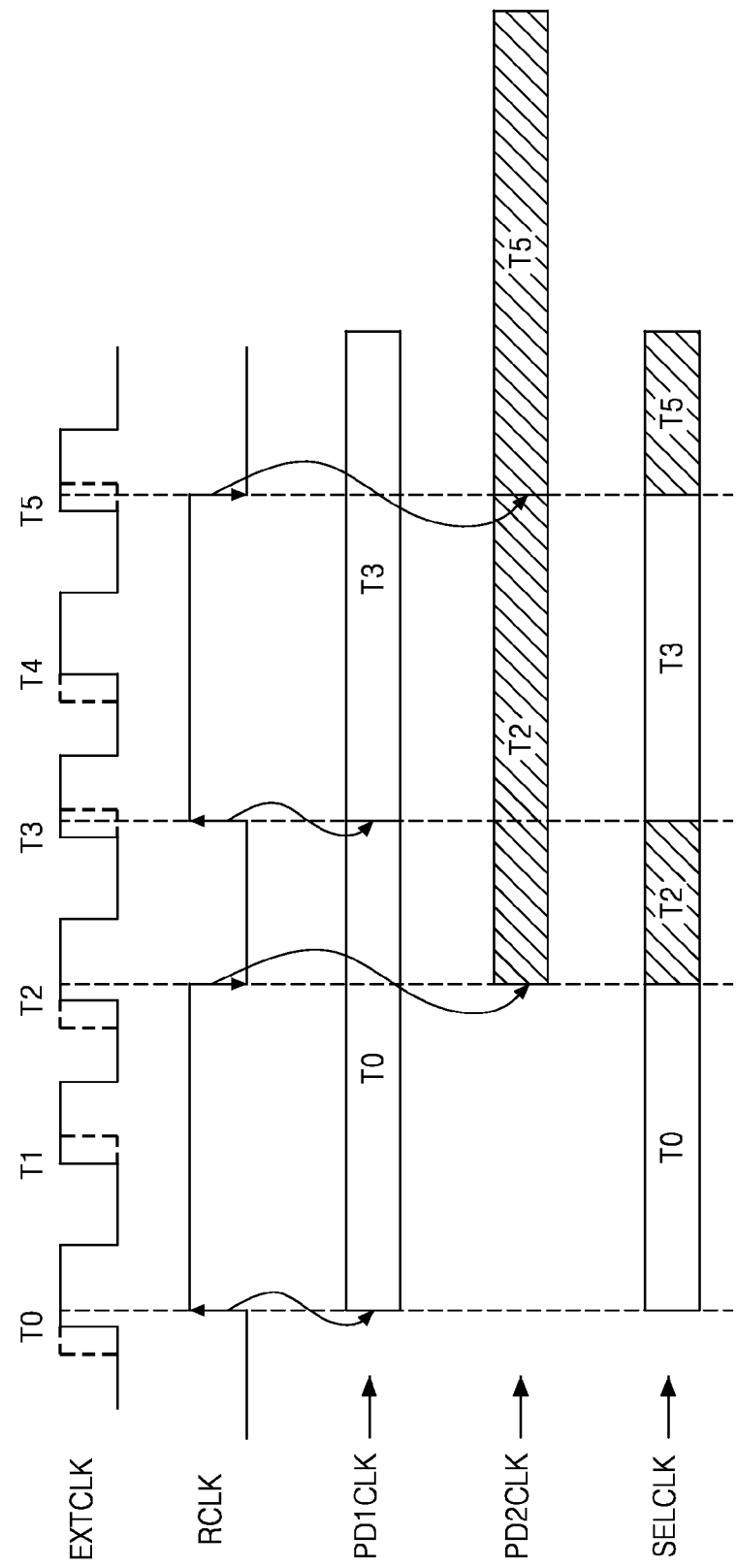
FIG. 4 is an exemplary timing diagram for explaining an operation of the DLL circuit of FIG. 1 when the divider illustrated in FIG. 1 is implemented by a divide-by-3 divider.

FIG. 4 is an exemplary timing diagram for explaining an operation of the DLL circuit 10-1 when the divider 24 is implemented by a divide-by-3 divider. An operation of the phase adjusting circuit 20 when the divider 24 is implemented by a divide-by-3 divider will now be described with reference to FIGS. 1, 2, and 4.

The first phase detector 28-1 detects the or phase information PD1CLK about the first portion T0 and the fourth portion T3 of the external clock signal EXTLCK, in response to a rising edge of the replica clock signal RCLK. The second phase detector 28-2 detects the phase information PD2CLK about the third portion T2 and a sixth portion T5 of the external clock signal EXTLCK, in response to a falling edge of the replica clock signal RCLK.

When the replica clock signal RCLK has a first level, for example, a high level, the selector 30 outputs the output signal PD1CLK of the first phase detector 28-1 to serve as the detection signal SELCLK. When the replica clock signal RCLK has a second level, for example, a low level, the selector 30 outputs the output signal PD2CLK of the second phase detector 28-2 to serve as the detection signal SELCLK. In this embodiment, the detection signal SELCLK includes most of the pieces of phase information, for example, phase information about the portions T0, T2, T3, and T5, of the external clock signal EXTCLK. However, the detection signal SELCLK does not include phase information about the second portion T1 and a fifth portion T4 of the external clock signal EXTCLK.

Figure 5:
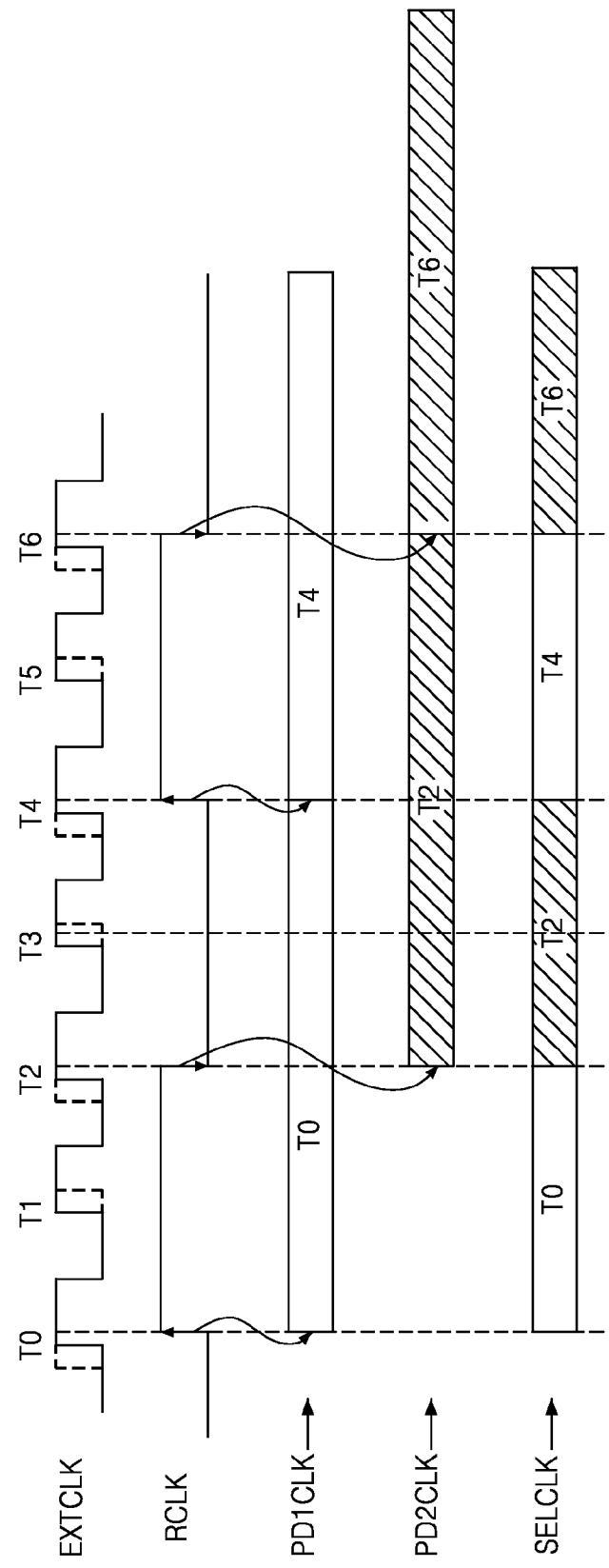
FIG. 5 is an exemplary timing diagram for explaining an operation of the DLL circuit of FIG. 1 when the divider illustrated in FIG. 1 is implemented by a divide-by-4 divider.

FIG. 5 is an exemplary timing diagram for explaining an operation of the DLL circuit 10-1 when the divider 24 is implemented by a divide-by-4 divider. An operation of the phase adjusting circuit 20 when the divider 24 is implemented by a divide-by-4 divider will now be described with reference to FIGS. 1, 2, and 5.

The first phase detector 28-1 detects the phase information PD1CLK about the first portion T0 and the fifth portion T4 of the external clock signal EXTLCK, in response to a rising edge of the replica clock signal RCLK. The second phase detector 28-2 detects the phase information PD2CLK about the third portion T2 and a seventh portion T6 of the external clock signal EXTLCK, in response to a falling edge of the replica clock signal RCLK.

When the replica clock signal RCLK has a first level, for example, a high level, the selector 30 outputs the output signal PD1CLK of the first phase detector 28-1 to serve as the detection signal SELCLK. When the replica clock signal RCLK has a second level, for example, a low level, the selector 30 outputs the output signal PD2CLK of the second phase detector 28-2 to serve as the detection signal SELCLK. Accordingly, when the divider 24 is implemented by a divide-by-4 divider, the detection signal SELCLK does not include phase information about the even-numbered portions T1, T3, and T5 of the external clock signal EXTCLK.

Figure 6:
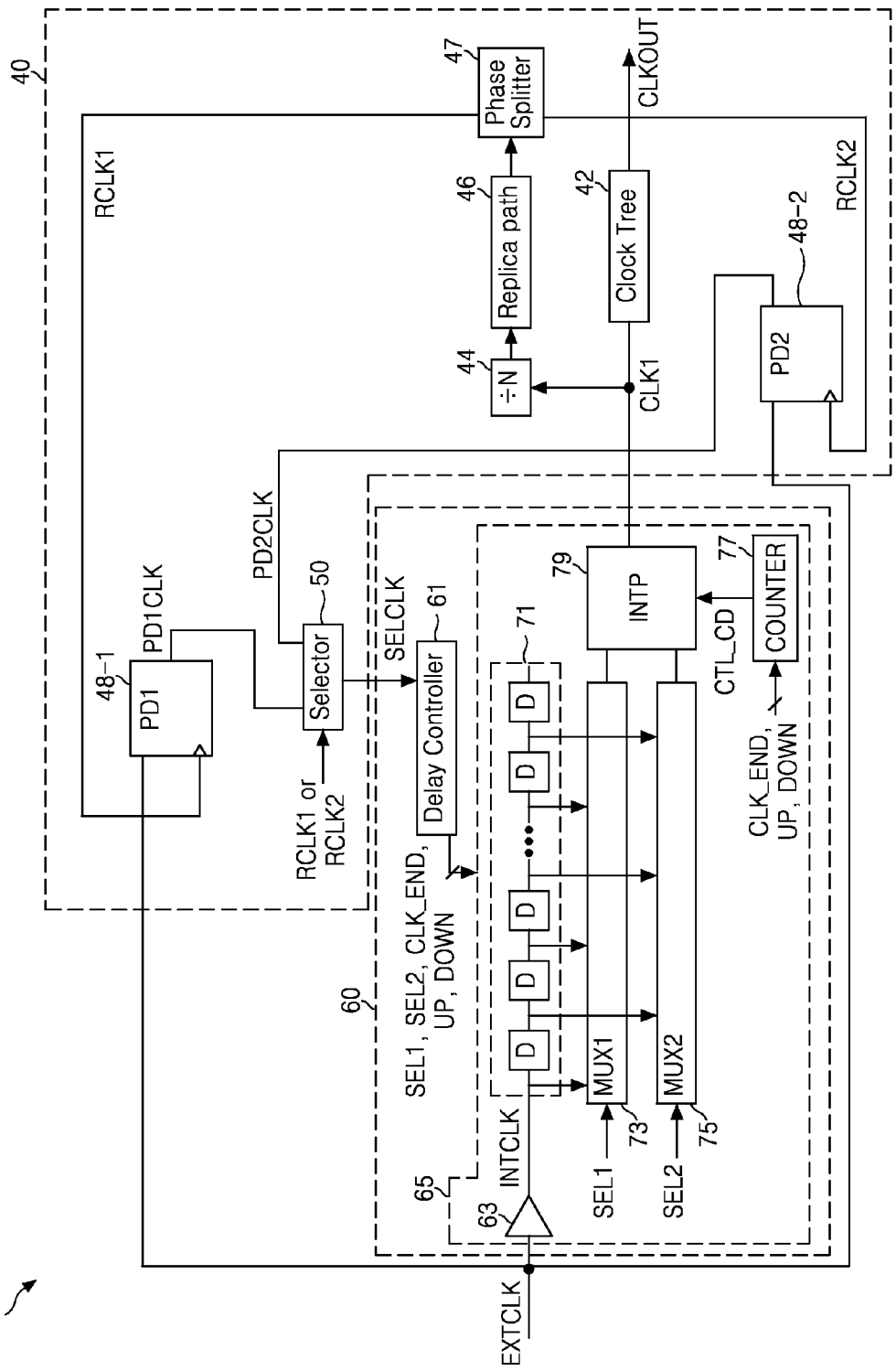
FIG. 6 is a block diagram of a DLL circuit according to another exemplary embodiment.

FIG. 6 is an exemplary block diagram of a DLL circuit 10-2 according to another embodiment. Referring to FIG. 6, the DLL circuit 10-2 includes a phase adjusting circuit 40 and a delay circuit 60.

The phase adjusting circuit 40 may detect phase information of the external clock signal EXTCLK by using a rising edge and a falling edge of a signal obtained by dividing a frequency of a clock signal CLK1 by N (where N is a natural number) (hereinafter, referred to as a N-divided signal), thereby generating a detection signal SELCLK. The phase adjusting circuit 40 may include a clock tree 42, a divider 44, a replica path 46, a phase splitter 47, a first phase detector 48-1, a second phase detector 48-2, and a selector 50.

The clock tree 42 is a circuit capable of controlling skew between clock signals and outputs a DLL clock signal CLKOUT corresponding to the clock signal CLK1. The DLL clock signal CLKOUT may be a signal obtained by delaying the clock signal CLK1. The divider 44 may divide the frequency of the clock signal CLK1 by N to output the N-divided signal, in order to reduce power which is to be consumed in the DLL circuit 10-2. The replica path 46 may delay an output signal of the divider 44, for a period of time equal to a delay time used in the clock tree 42.

The phase splitter 47 may split an N-divided delay signal output by the replica path 26 to generate a first replica clock signal RCLK1 and a second replica clock signal RCLK2 that have a phase difference of 180 degrees. Accordingly, the N-divided delay signal output from the replica path 46 and the first replica clock signal RCLK1 are substantially the same as each other, but the N-divided delay signal output from the replica path 46 and the second replica clock signal RCLK2 are 180 degrees out of phase from each other. In one embodiment, the first phase detector 48-1 may detect phase information PD1CLK of the external clock signal EXTCLK in response to a rising edge of the first replica clock signal RCLK1, and the second phase detector 48-2 may detect phase information PD2CLK of the external clock signal EXTCLK in response to a rising edge of the second replica clock signal RCLK2. Each of the first phase detector 48-1 and the second phase detector 48-2 may be implemented by a D-flip-flop.

Figure 7:
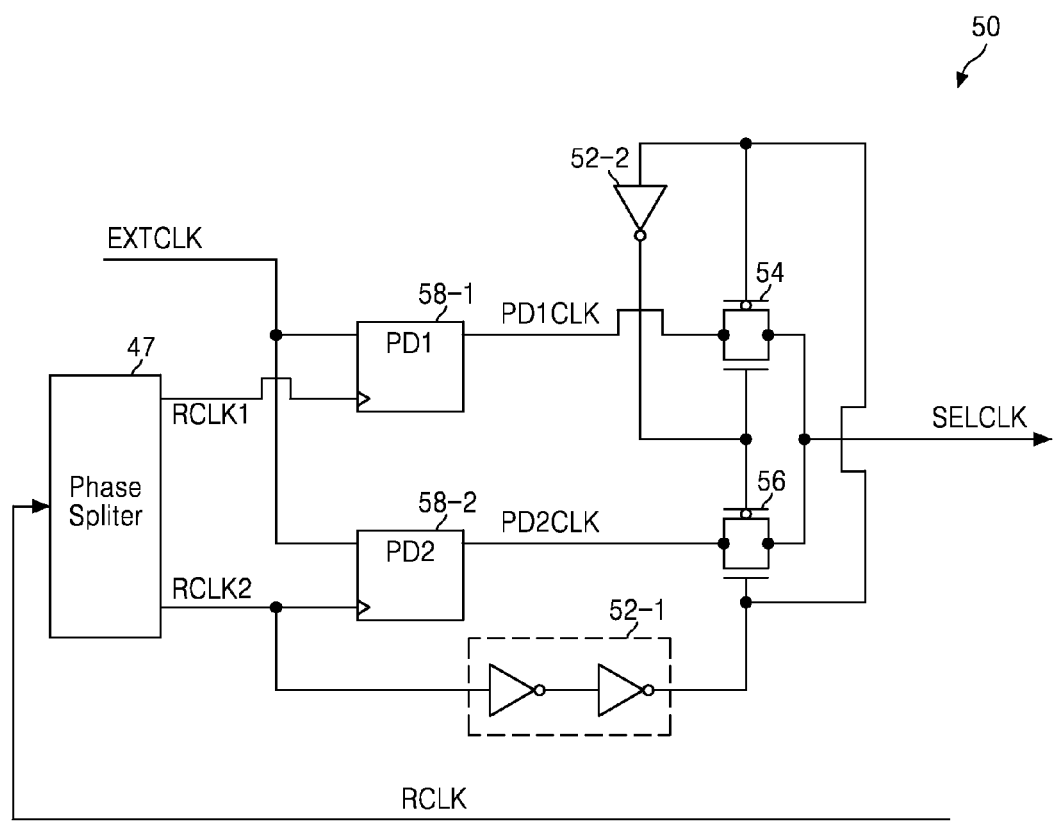
FIG. 7 is an exemplary circuit diagram of a selector of the DLL circuit illustrated in FIG. 6.

FIG. 7 is an exemplary circuit diagram of the selector 50 illustrated in FIG. 6. For convenience of explanation, FIG. 7 illustrates the selector 50 together with a first phase detector 58-1 and a second phase detector 58-2. In one embodiment, the selector 50 may include a gating signal generator, a first transmission circuit 54, and a second transmission circuit 56. The gating signal generator includes an inverter chain 52-1 and an inverter 52-2 and controls an operation of the first transmission circuit 54 and an operation of the second transmission circuit 56.

The inverter chain 52-1, having a plurality of inverters serially connected to each other, buffers the second replica clock signal RCLK2 to output a control signal for controlling the operations of the first transmission circuit 54 and the second transmission circuit 56. In some embodiments, the inverter chain 52-1 may buffer the first replica clock signal RCLK1 to output a control signal for controlling the operations of the first transmission circuit 54 and the second transmission circuit 56. The inverter 52-2 may invert the control signal output by the inverter chain 52-1 so as to output an output signal for controlling the operations of the first transmission circuit 54 and the second transmission circuit 56.

The first transmission circuit 54 outputs the phase information PD1CLK of the external clock signal EXTCLK so as to serve as the detection signal SELCLK, in response to a rising edge of the first replica clock signal RCLK1 and when the first replica clock signal RCLK1 has a high level). The second transmission circuit 56 outputs the phase information PD2CLK of the external clock signal EXTCLK so as to serve as the detection signal SELCLK, in response to a rising edge of the second replica clock signal RCLK2 and when the second replica clock signal RCLK2 has a high level.

Accordingly, the selector 50 may output an output signal PD1CLK of the first phase detector 58-1, namely, the edge information or phase information PD1CLK output by the first phase detector 58-1, in response to a rising edge and logical high signal of the first replica clock signal RCLK1, or an output signal PD2CLK of the second phase detector 58-2, namely, the edge information or phase information PD2CLK output by the second phase detector 58-2, to serve as the detection signal SELCLK, in response to a rising edge and logical high signal of the second replica clock signal RCLK2.

Figure 8:
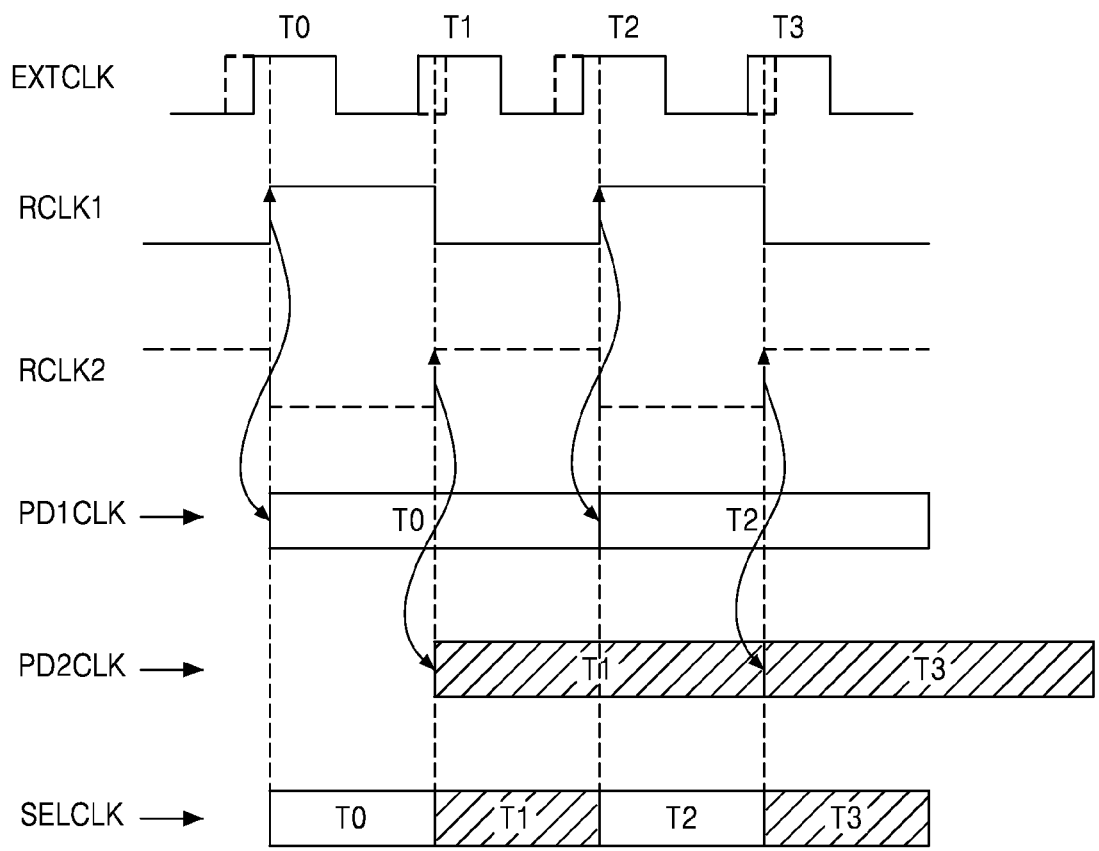
FIG. 8 is an exemplary timing diagram for explaining an operation of the DLL circuit of FIG. 6 when the divider illustrated in FIG. 6 is implemented by a divide-by-2 divider.

FIG. 8 is an exemplary timing diagram for explaining an operation of the DLL circuit 10-2 when the divider 44 is implemented by a divide-by-2 divider. An operation of the phase adjusting circuit 40 when the divider 44 is implemented by a divide-by-2 divider will now be described with reference to FIGS. 6 and 7. The external clock signal EXTCLK is input to a buffer 63 of the delay circuit 60. The edge information of the external clock signal EXTCLK may vary due to dynamic jitter. A dotted portion of FIG. 8 indicates a case where the edge information of the external clock signal EXTCLK varies due to the dynamic jitter.

The divider 44 divides the clock signal CLK1 by 2 to output a 2-divided signal. The replica path 46 delays the 2-divided signal for a period of time equal to a delay time used in the clock tree 22 so as to output a replica clock signal. The replica clock signal is split into the first replica clock signal RCLK1 and the second replica clock signal RCLK2 that have a phase difference of 180 degrees, by the phase splitter 47.

The first phase detector 48-1 detects phase information about a first portion T0 and a third portion T2 of the external clock signal EXTLCK, in response to a rising edge of the first replica clock signal RCLK1. The second phase detector 48-2 detects phase information about a second portion T1 and a fourth portion T3 of the external clock signal EXTLCK, in response to a rising edge of the second replica clock signal RCLK2.

In one embodiment, when the second replica clock signal RCLK2 has a second level, for example, a low level, the selector 50 outputs the output signal PD1CLK of the first phase detector 58-1, and when the second replica clock signal RCLK2 has a first level, for example, a high level, the selector 50 outputs the output signal PD2CLK of the second phase detector 58-2. Alternatively, the output signal output by selector 50 could depend on the state of the first replica clock signal RCLK1. Accordingly, the detection signal SELCLK may include information about all rising edges of the external clock signal EXTCLK.

The DLL circuit 10-2 according to one embodiment may detect the edge information or phase information of the external clock signal EXTCLK by using a rising edge and a falling edge of the 2-divided signal obtained by the divider 44. Thus, the DLL circuit 10-2 may track all of the rising edges of the external clock signal EXTCLK.

Figure 9:
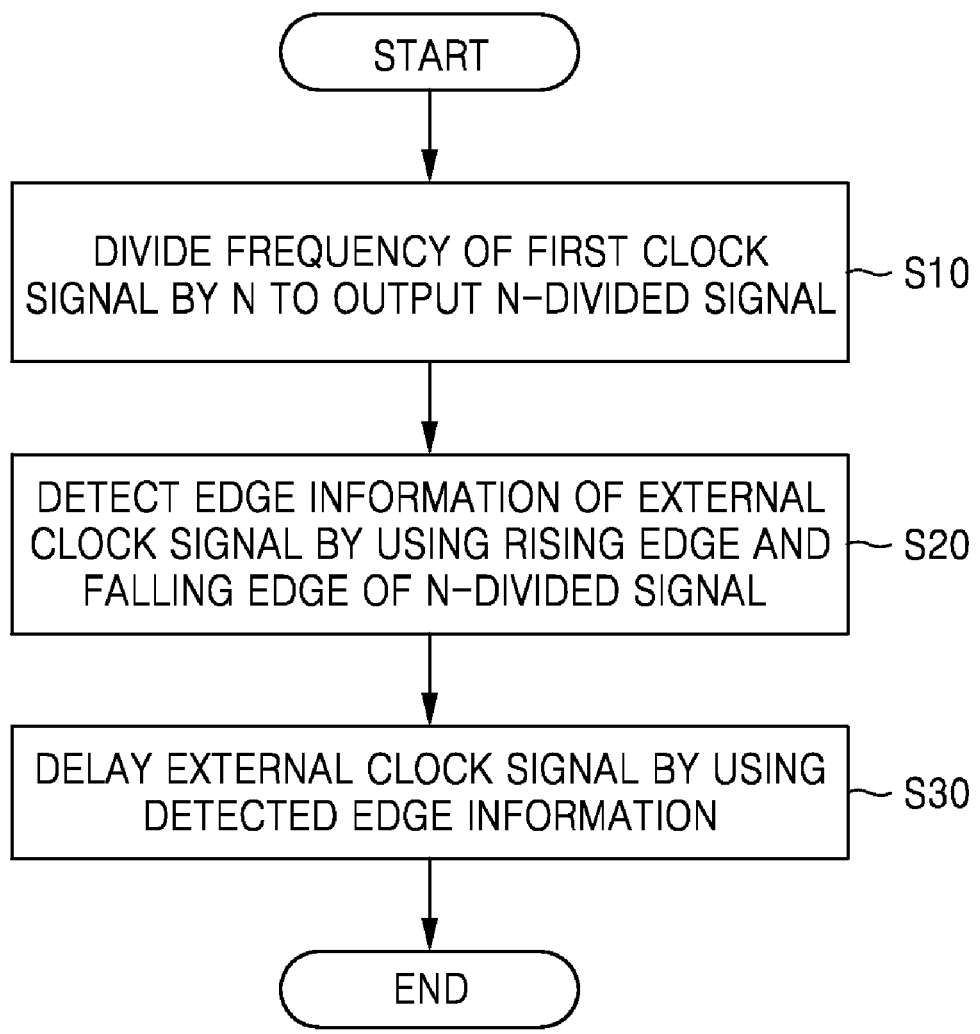
FIG. 9 is a flowchart of an exemplary operation of the DLL circuit of FIG. 1 or 6, according to one embodiment.

FIG. 9 is an exemplary flowchart of an operation of the DLL circuit 10-1 or 10-2 of FIG. 1 or 6. Referring to FIGS. 1, 6, and 9, the divider 24 or 44 divides the frequency of the clock signal CLK1 by N to output the N-divided signal, in operation S10.

The N-divided signal output by the divider 24 or 44 is delayed for a period of time equal to a delay time used in the clock tree 22, by the replica path 26. Accordingly, the replica path 26 outputs the replica clock signal. In operation S20, the phase adjusting circuit 20 or 40 detects the edge information or phase information of the external clock signal EXTCLK by using a rising edge and a falling edge of the replica clock signal. In other words, the phase adjusting circuit compares the external clock signal EXTCLK to a replica clock signal (or two 180 degree out of phase replica clock signals) to determine whether the edges of the EXTCLK signal are in phase with the edges of the replica clock signal. In operation S30, the delay circuit 60 adjusts the phase of the external clock signal EXTCLK by using the phase information of the external clock signal EXTCLK detected by the phase adjusting circuit 20 or 40, thereby outputting the phase-adjusted external clock signal as the clock signal CLK1. In one embodiment, the phase-adjusted external clock signal is set such that CLKOUT is in phase with EXTCLK.

Figure 10:
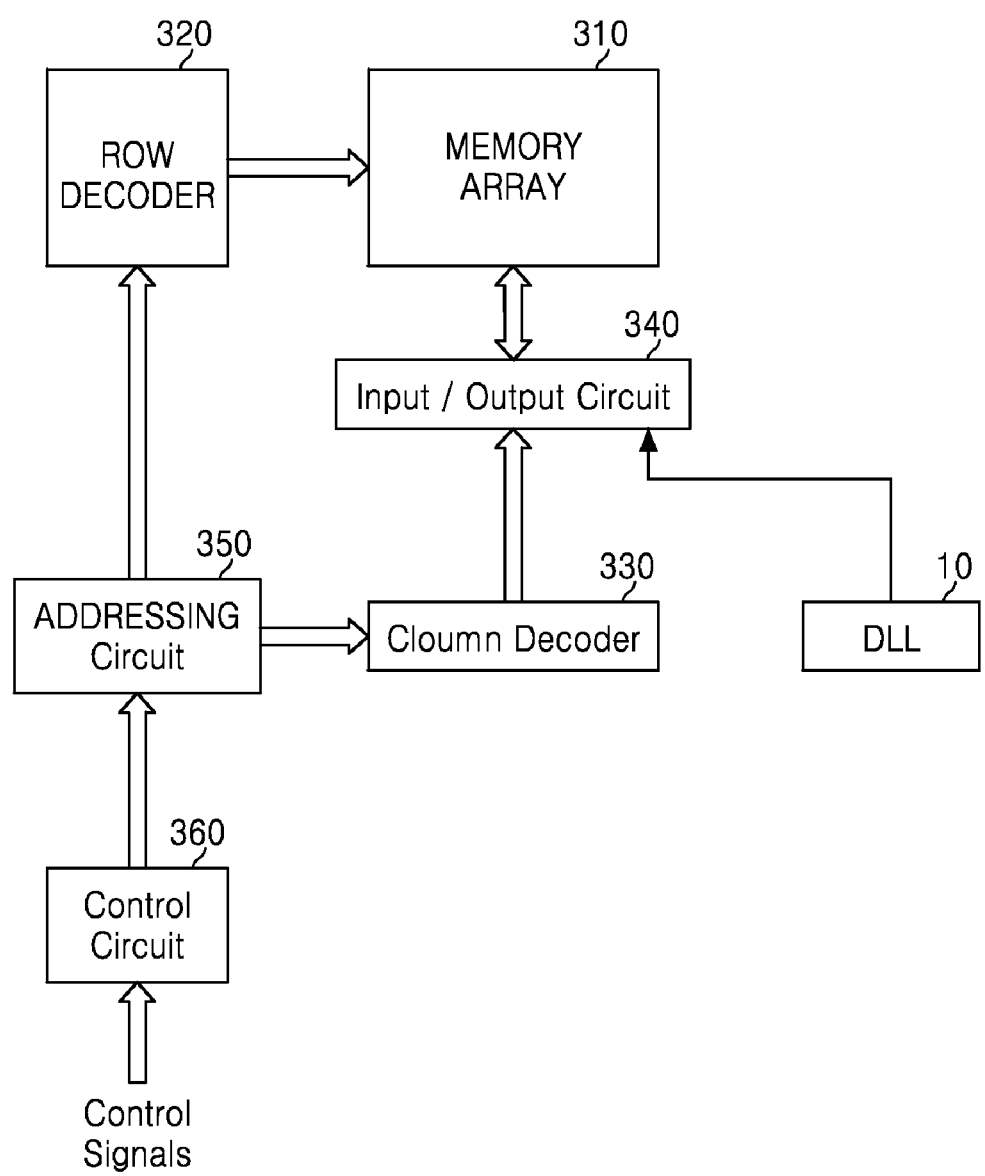
FIG. 10 is an exemplary block diagram of a semiconductor device including the DLL circuit illustrated in FIG. 1 or 6, according to one embodiment.

FIG. 10 is an exemplary block diagram of a semiconductor device 300 including the DLL circuit 10-1 or 10-2 illustrated in FIG. 1 or 6, according to one embodiment. Referring to FIG. 10, the semiconductor device 300 includes the DLL circuit 10-1 or 10-2 (which are generally indicated as a DLL circuit 10), a memory array 310, a row decoder 320, a column decoder 330, an input/output circuit 340, an addressing circuit 350, and a control circuit 360.

The memory array 310 includes a plurality of wordlines, a plurality of bitlines, and a plurality of memory cells connected between the wordlines and the bitlines. Each of the memory cells may be implemented by a volatile memory cell such as a DRAM or an SDRAM.

Alternatively, each of the memory cells may be implemented by a non-volatile memory cell. Each of the non-volatile memory cells may be implemented by Electrically Erasable Programmable Read-Only Memory (EEPROM), flash memory, magnetic RAM (MRAM), Spin-Transfer Torque MRAM, conductive bridging RAM (CBRAM), Ferroelectric RAM (FeRAM), Phase change RAM (PRAM), Resistive RAM (RRAM or ReRAM), nanotube RRAM, polymer RAM (PoRAM), nano floating gate memory (NFGM), holographic memory, Molecular Electronics Memory Device, or Insulator Resistance Change Memory. Each of the non-volatile memory cells may store one bit or a plurality of bits.

The row decoder 320 receives a row address from the addressing circuit 350 and decodes the row address so as to select one wordline from the wordlines. The column decoder 330 receives a column address from the addressing circuit 350 and decodes the column address so as to selects one bitline from the bitlines.

The input/output circuit 340 may write data to at least one memory cell selected by the row decoder 320 and the column decoder 330. The input/output circuit 340 may read data from at least one memory cell selected by the row decoder 320 and the column decoder 330. The input/output circuit 340 may include a plurality of sense amplifiers for sensing and amplifying data DATA to be read during a read operation, and a plurality of drivers for driving data DATA to be written during a write operation.

The addressing circuit 350 may generate row addresses and column addresses under the control of the control circuit 360. The control circuit 360 generates a plurality of operation control signals for controlling an operation of the addressing circuit 350, in response to a plurality of control signals required to perform a read operation or a write operation.

As described above with reference to FIGS. 1 through 9, the DLL circuit 10 generates the DLL clock signal CLKOUT synchronized with the external clock signal EXTCLK by using a rising edge and a falling edge of the N-divided delay signal. The input/output circuit 340 may input/output data in response to the DLL clock signal CLKOUT output from the DLL circuit 10.

Figure 11:
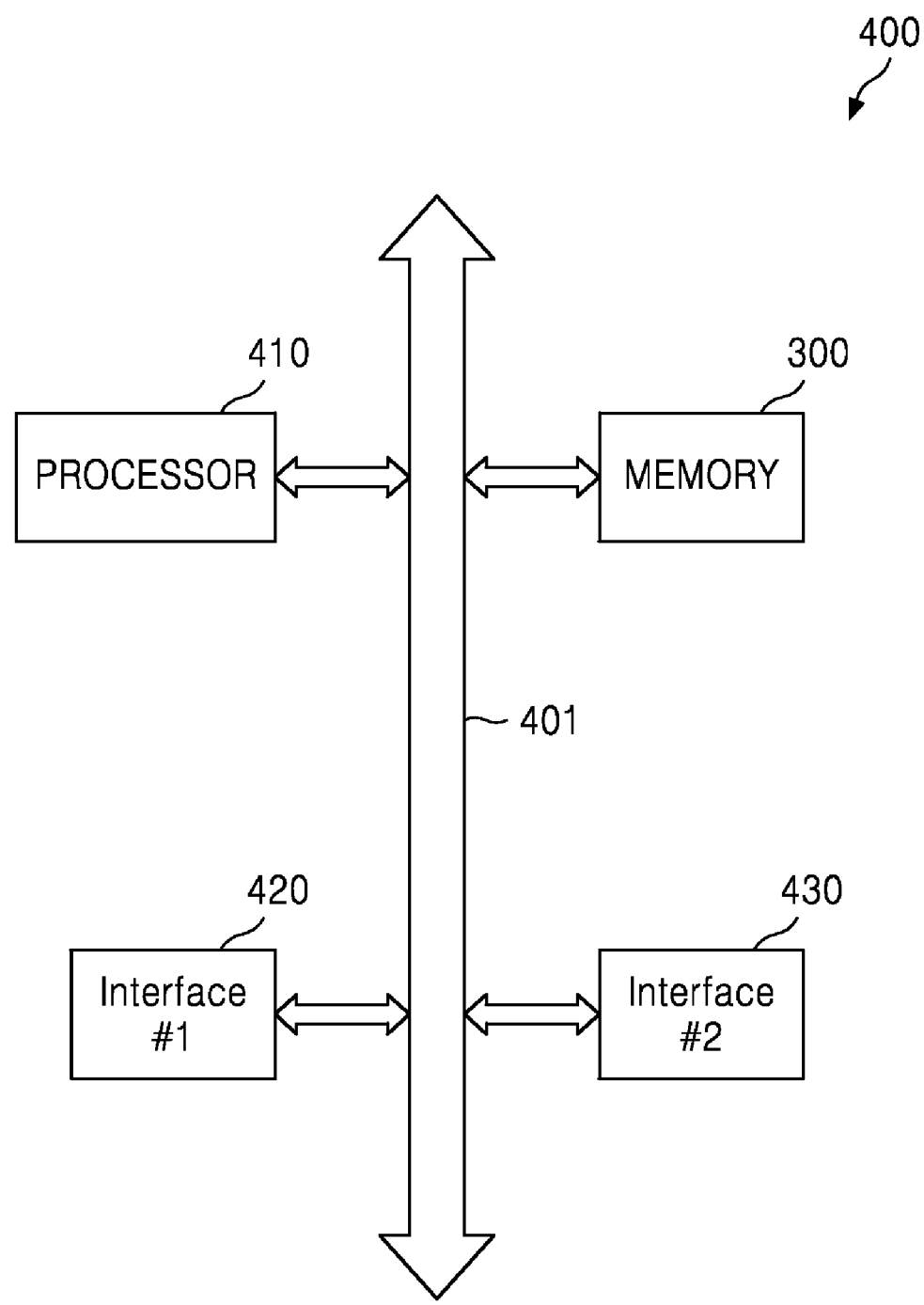
FIG. 11 is an exemplary block diagram of a semiconductor system including the semiconductor device illustrated in FIG. 10.

FIG. 11 is an exemplary block diagram of a semiconductor system 400 including the semiconductor device 300 illustrated in FIG. 10, according to one embodiment. Referring to FIG. 11, the semiconductor system 400 may be used in personal computers, portable computers, portable mobile communications devices, consumer equipment (CE), or other electronic devices that use semiconductor technology.

The portable mobile telecommunications devices may include, for example, mobile telephones, smart phones, personal digital assistants (PDAs), or portable multimedia players (PMP). The semiconductor system 400 may be, for example, a memory card or an electronic book. The semiconductor system 400 may also be, for example, a game player, a game controller, a navigator, an electronic instrument, or Information Technology (IT) device. The CE may be, for example, a digital TV, a home automation device, or a digital camera.

The semiconductor system 400 includes the semiconductor device 300 and a processor 410. Thus, the semiconductor device 300 and the processor 410 may transmit data to or receive data from each other via a bus 401. For example, the processor 410 may control the entire memory access operation of the semiconductor device 300. The semiconductor system 400 may further include an interface module 420. The interface module 420 may be a wireless communication module. Thus, the interface module 420 may transmit data stored in the semiconductor device 300 to the outside via wireless communications and store data received from an external source in the semiconductor device 300, under the control of the processor 410.

In some embodiments, the interface module 420 may be an image sensor. Thus, the image sensor may store a digital signal generated from a picked-up image in the semiconductor device 300 and transmit data stored in the semiconductor device 300 to the outside via an input/output interface 430, under the control of the processor 410. The semiconductor system 400 may further include the input/output interface 430. The input/output interface 430 may be a display device. Alternatively, the input/output interface 430 may be an input device such as a keyboard, a mouse, or a scanner, or an output device such as a printer.

The DLL circuit described above may be used in any electronic system that uses an external clock that should be synchronized with an internal clock. For example, it could be used in a semiconductor memory system, another integrated circuit system, or a microprocessor system. A DLL circuit according to the embodiments described above may detect the phase of an external clock signal by using a rising edge and a falling edge of an N-divided signal obtained from a clock signal, and may adjust the phase of the external clock signal according to a result of the detection, thereby reducing periodic dynamic jitter and using less power.

While the figures and description above has been particularly shown and described with reference to exemplary embodiments thereof, it will be understood that various changes in form and details may be made therein without departing from the spirit and scope of the following claims.

What is claimed is:

1. A delay locked loop (DLL) circuit comprising:
a delay circuit;
a phase adjusting circuit configured to receive a clock signal output from the delay circuit, pass the clock signal through a N-divider and a replica path to create a N-divided delay signal, and detect phase information about an external clock signal in response to a rising edge and a falling edge of the N-divided delay signal, wherein N denotes a natural number;
a first phase detector configured to detect the phase information about the external clock signal in response to the rising edge of the N-divided delay signal;
a second phase detector configured to detect the phase information about the external clock signal in response to the falling edge of the N-divided signal; and
a selector configured to output either an output signal of the list phase detector or an output signal of the second phase detector as a result of the detections, wherein;
the N-divider is configured to divide a frequency of the clock signal by N to output a N-divided signal, and
the delay circuit is configured to output the clock signal by adjusting a phase of the external clock signal in response to a result of the detection.

2. The DLL circuit of claim 1, wherein the replica path is configured to receive the N-divided signal and output the N-divided delay signal by delaying an output signal of the N-divider for a period of time equal to a delay time used in a clock tree.

3. The DLL circuit of claim 1, wherein the delay circuit comprises a delay controller that receives a result of the detection, and wherein the delay controller is configured to output control signals in response to the result of the detection, and is configured to only change the output control signals as a result of the detection having a predetermined level M times or more in a row, where M denotes a natural number.

4. The DLL circuit of claim 1, further comprising:
a phase splitter configured to split the phase of the N-divided delay signal to generate a first replica clock signal and a second replica clock signal that have a phase difference of 180 degrees,
wherein the first phase detector is configured to detect phase information about the external clock signal in response to the first replica clock signal; and
the second phase detector is configured to detect phase information about the external clock signal in response to the second replica clock signal.

5. The DLL circuit of claim 4, wherein the replica path is configured to receive the N-divided signal and to output the N-divided delay signal by delaying the output signal of the N-divider for a period of time equal to a delay time used in a clock tree.

6. The DLL circuit of claim 4, wherein the first phase detector is configured to detect phase information about the external clock signal based on a rising edge of the first replica clock signal, and the second phase detector is configured to detect phase information about the external clock signal based on a rising edge of the second replica clock signal.

7. The DLL circuit of claim 1, wherein the delay circuit comprises:
a delay controller configured to output a plurality of control signals to adjust the phase of the external clock signal in response to the result of the detection; and
a delay core configured to output the clock signal by adjusting the phase of the external clock signal in response to the plurality of control signals.

8. The DLL circuit of claim 1, wherein N is 2, 3, or 4.

9. A semiconductor device comprising:
an output circuit configured to output data in response to a DLL clock signal; and
a DLL circuit configured to generate the DLL clock signal,
wherein the DLL circuit comprises:
a delay circuit;
a phase adjusting circuit configured to receive a clock signal output from the delay circuit, pass the clock signal through a N-divider and a replica path to create a N-divided delay signal, and detect phase information about an external clock signal in response to a rising edge and a falling edge of the N-divided delay signal, wherein N denotes a natural number; and
a clock tree configured to generate the DLL clock signal in response to the clock signal,
wherein the delay circuit is configured to output the clock signal by adjusting a phase of the external clock signal in response to a result of the detection, and
wherein the phase adjusting circuit comprises:
a first phase detector configured to detect the phase information about the external clock signal in response to the rising edges of the N-divided delay signal;
a second phase detector configured to detect the phase information about the external clock signal in response to the falling edges of the N-divided delay signal; and
a selector configured to output an output signal of the first phase detector or an output signal of the second phase detector as a result of the detections,
wherein the N-divider is configured to divide a frequency of the clock signal by N to output a N-divided signal.

10. The semiconductor device of claim 9, further comprising:
a phase splitter configured to split the phase of the N-divided delay signal to generate a first replica clock signal and a second replica clock signal that have a phase difference of 180 degrees, wherein
the first phase detector is configured to detect the phase information about the external clock signal in response to the first replica clock signal, and
the second phase detector is configured to detect the phase information about the external clock signal in response to the second replica clock signal.

11. The semiconductor device of claim 9, wherein:
the first phase detector comprises a first flip flop; and
the second phase detector comprises a second flip flop.

12. A semiconductor system comprising:
a semiconductor device; and
a processor for controlling an operation of the semiconductor device,
wherein the semiconductor device comprises:
an output circuit for outputting data in response to a DLL clock signal; and
a DLL circuit for generating the DLL clock signal,
wherein the DLL circuit comprises:
a phase adjusting circuit for receiving a clock signal output from a delay circuit, dividing the clock signal by N and passing the clock signal through a replica path to create a N-divided delay signal, and detecting phase information about an external clock signal in response to a rising edge and a falling edge of the N-divided delay signal, wherein N denotes a natural number;
a delay circuit for outputting the clock signal by adjusting a phase of the external clock signal in response to a result of the detection; and
a clock tree for generating the DLL clock signal in response to the clock signal, and
wherein the phase adjusting circuit comprises:
a N-divider for dividing a frequency of the clock signal by N to output a N-divided signal;
a first phase detector, for detecting the phase information about the external clock signal in response to the rising edge;
the second phase detector, for detecting the phase information about the external clock signal in response to the falling edge; and
a selector for outputting either an output signal of the first phase detector or an output signal of the second phase detector as a result of the detection.

13. The semiconductor system of claim 12, further comprising:
a phase splitter for splitting the phase of the N-divided delay signal to generate a first replica clock signal and a second replica clock signal that have a phase difference of 180 degrees; wherein
the first phase detector is for detecting the phase information about the external clock signal in response to the first replica clock signal; and
the second phase detector is for detecting the phase information about the external clock signal in response to the second replica clock signal.

* * * * *